United States Patent
Bakucz et al.

(10) Patent No.: US 12,026,081 B2
(45) Date of Patent: Jul. 2, 2024

(54) METHOD FOR VALIDATING A SOFTWARE

(71) Applicant: Robert Bosch GmbH, Stuttgart (DE)

(72) Inventors: Peter Bakucz, Klosterlechfeld (DE); Balazs Leidecker, Budapest (HU); Davut Cimsit, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 521 days.

(21) Appl. No.: 17/147,141

(22) Filed: Jan. 12, 2021

(65) Prior Publication Data
US 2021/0232489 A1 Jul. 29, 2021

(30) Foreign Application Priority Data
Jan. 23, 2020 (DE) .......................... 102020200785.3

(51) Int. Cl.
| | |
|---|---|
| *G06F 11/36* | (2006.01) |
| *G05D 1/00* | (2024.01) |
| *G06F 17/17* | (2006.01) |
| *G06N 20/00* | (2019.01) |
| *H03H 17/06* | (2006.01) |
| *H03H 21/00* | (2006.01) |
| *H04L 5/00* | (2006.01) |

(52) U.S. Cl.
CPC ....... *G06F 11/3616* (2013.01); *G05D 1/0257* (2013.01); *G06N 20/00* (2019.01); *H03H 21/0012* (2013.01); *H04L 5/0048* (2013.01); *G06F 17/17* (2013.01); *H03H 17/06* (2013.01)

(58) Field of Classification Search
CPC ..... G06F 11/3616; G06F 17/17; G06N 20/00; G05D 1/0257; H03H 21/0012; H03H 17/06; H04L 5/0048
See application file for complete search history.

(56) References Cited

U.S. PATENT DOCUMENTS

| | | | |
|---|---|---|---|
| 9,933,517 B1 * | 4/2018 | Olekas | G01S 13/56 |
| 10,409,705 B2 * | 9/2019 | Jagadeesan | G06F 9/44589 |
| 10,467,124 B2 * | 11/2019 | Tang | G06F 11/3664 |
| 11,494,291 B2 * | 11/2022 | Stocker | G06F 11/3616 |
| 2017/0228279 A1 * | 8/2017 | Mariani | G06F 11/008 |
| 2019/0071026 A1 * | 3/2019 | Terashima | G10K 11/175 |
| 2020/0050534 A1 * | 2/2020 | Sze | G06F 11/277 |
| 2020/0152219 A1 * | 5/2020 | Christoph | G10L 21/0232 |

(Continued)

*Primary Examiner* — S. Sough
*Assistant Examiner* — Zheng Wei
(74) *Attorney, Agent, or Firm* — NORTON ROSE FULBRIGHT US LLP; Gerard A. Messina

(57) ABSTRACT

A method for validating a software, particularly a driver-assistance software. The method includes receiving of a sensor signal that is to be processed by the software; determining of a reference signal by an adaptive filter based on the sensor signal, the reference signal representing an anticipated sensor signal; determining an error signal based on the sensor signal and the reference signal, the error signal representing a performance of the software; determining an anti-sensor signal by a machine-learning unit based on the sensor signal, the machine-learning unit being trained with sensor signals already evaluated; controlling of the adaptive filter by a control unit based on the determined error signal and the adaptive anti-sensor signal; and validation of the software based on the determined error signal.

10 Claims, 2 Drawing Sheets

(56) References Cited

U.S. PATENT DOCUMENTS

| | | | |
|---|---|---|---|
| 2020/0168094 A1* | 5/2020 | Shimodaira | G08G 1/164 |
| 2020/0183806 A1* | 6/2020 | Lin | G06F 11/3664 |
| 2020/0210323 A1* | 7/2020 | Kuricheti | G06F 11/3692 |
| 2020/0218634 A1* | 7/2020 | Jones | G06F 11/3616 |
| 2020/0341830 A1* | 10/2020 | Bangad | G06F 11/0772 |

* cited by examiner

METHOD FOR VALIDATING A SOFTWARE

CROSS REFERENCE

The present application claims the benefit under 35 U.S.C. § 119 of German Patent Application No. DE 102020200785.3 filed on Jan. 23, 2020, which is expressly incorporated herein by reference in its entirety.

FIELD

The present invention relates to a method for validating a software, a device for carrying out the method, a control method for an at least semi-autonomous robot, a computer program and a machine-readable storage medium.

BACKGROUND INFORMATION

The current validation of software, particularly of driver-assistance systems, is based above all on what is referred to as the endurance test. After several thousand kilometers of driving, the measured and projected values are compared to each other and the software is adapted accordingly. For autonomous driving, where over 100,000 kilometers must of necessity be tested, this "classic method" is not usable.

That is why there is the desire to provide an improved method for validating a software.

SUMMARY

According to one aspect of the present invention, a method for validating a software, particularly a driver-assistance software, is provided. In accordance with an example embodiment of the present invention, the method includes the following steps. Receiving of a sensor signal that is to be processed by the software. Determining of a reference signal by an adaptive filter based on the sensor signal, the reference signal representing an anticipated sensor signal. Determining of an error signal based on the sensor signal and the reference signal, the error signal representing a performance of the software. Determining of an anti-sensor signal by a machine-learning unit based on the sensor signal, the machine-learning unit being trained with sensor signals already evaluated. Control of the adaptive filter by a control unit based on the determined error signal and the anti-sensor signal. Validation of the software based on the determined error signal.

The signal to be expected is preferably a signal which, based on earlier measurements, represents a sensor signal as expected based on a trained model of the sensor, for example. Preferably, the trained model of the sensor is based on the earlier measurements.

The sensor signal is provided preferably by an environmental sensor of a robot, particularly a robot—especially a vehicle—moving in at least partially automated fashion. For example, the sensor signal is provided by a radar sensor, a LIDAR sensor, an imaging sensor and/or a thermal sensor.

Preferably, the adaptive filter is controlled by an algorithm which is based on the determined error signal and the adaptive anti-sensor signal. The performance of the algorithm is the number of iterations which the adaptive filter needs in order to attain a specific error. In other words, an invariant mathematical distance is sought between the learned sensor signal (thus, the transfer of the original sensor signal by way of a neural network) and the actual (adapted) sensor signal.

The machine-learning unit preferably includes a neural network.

By preference, the reference signal is referred to as anti-reference signal, since in comparison to the sensor signal, the reference signal represents a signal basically inverted relative to the sensor signal, so that the error signal is determined by a simple adding of sensor signal and reference signal. In the ideal case, upon adding, the sensor signal and the reference signal completely cancel each other out. The error signal may thus be interpreted as the difference between the sensor signal and the reference signal.

Preferably, the adaptive filter, which determines the reference signal, is based on real measurement data determined beforehand.

In this way, the adaptive filter is actively controlled and, by way of the error signal made possible by the adaptive filter, is used for validating the software, especially its performance. Consequently, the adaptive filter is able to be adapted during the operation of the software, e.g., during the detection of the surroundings of a vehicle having the driver-assistance software.

Therefore, the adaptive filter is able to react directly to changes in the input signal such as, e.g., changed representative traffic situations.

In this manner, especially based on adaptive transfer functions, the validation and testing of software is simplified.

In addition, the validation and test volume is thus reduced significantly.

Furthermore, the machine-learning unit constantly becomes more efficient, and new test results may be integrated continuously into the method.

The adaptive method may thus be used in real-time-embedded surroundings, the software being able to be observed in real time.

In one preferred specific embodiment of the present invention, the adaptive filter is actively controlled by the control unit.

In one preferred specific embodiment, the control unit uses a modified LMS (least-mean-square) algorithm as control algorithm for controlling the adaptive filter.

By using the modified LMS algorithm, the highly non-linear problem of validating the software is simplified to a linear problem. In other words, the modified LMS algorithm predicts the controller outputs from which the sensor signal is provided. The modified LMS algorithm includes a modified LMS model, which may easily be used for a robust control of the adaptive filter. Put another way, the predictive control is based on robust linear programming, the resulting algorithm for determining a possible reliability of the software being based on the spectral theory.

The modified LMS algorithm is preferably a modified version of the LMS algorithm. The effect of an uncertainty model on the performance of a 12-predictive model controller with input conditions and input-rate conditions is thus analyzed mathematically.

The control unit is preferably what is referred to as an open-context system. The software must adjust continuously to new traffic situations or must spontaneously recognize and classify objects appearing in the image area. The real world defined by the neural network in the secondary path of the adaptive filter which, for example, may be a FIR filter with several hundred learned parameters, also defines the mathematical distance between the actual measured instantaneous sensor values and the learned sensor values trained off-line. Since this metric is not comparable in different cases and is not intended for embedded real-time systems, an adaptation must be carried out, for which the modified LMS algorithm is determined.

The "normal" LMS algorithm does not apply, in view of the transfer from the filter output (y(n)) to the error signal (e(n)).

The analysis of the error signal in the Z-domain yields the following equation:

$$e(z)=[H(z)-S(z)\cdot W(z)]\cdot x(z)$$

where H(z) and S(z) represent transfer functions, W(z) represents the adaptive filter, x represents the sensor signal and e represents the error signal.

If the performance determination is functioning, the system is stable. The remaining error is ideally zero. (e(z)=0). Consequently:

$$W(z)=H(z)/S(z)$$

In other words, the adaptive filter must model H(z) and the inverse of the secondary path simultaneously.

This design raises various problems. The task is impossible if the transfer path of P(z), thus, the primary path, does not have at least as much delay as S(z), thus, the secondary path.

The scope of application of the regulation becomes unstable if there is a frequency co for which S(ω)=0 is true.

A controller which uses an LMS algorithm is unstable with the secondary path.

The modified LMS algorithm is a filtered LMS algorithm based on a neural network and measures the mathematical distance between existing, learned, referenced sensor sequences and instantaneous real-time sequences. The number of iterations of the adaptive filter is the performance of the algorithm, since with the help of neural networks (secondary-path estimate), it is known how it should function. Because the distance cannot be minimized all at once, an iterative process via adaptive filtering is employed.

Originally, the modified LMS algorithm was introduced for noise suppression without a neural network. In this case for the software, especially self-propelling vehicle software, the quality of the software algorithm is a modification of the modified LMS algorithm with a neural network. The input for the adaptive filter is preferably a measuring signal and not a random noise, for example.

An improved method for validating a software is thereby provided.

Adapting the error signal ensures that the process is not infinite. In this, the method described differs fundamentally from the classic adaptive filter algorithm FxLMS.

In this way, an improved method is provided for validating a software.

In one preferred specific embodiment of the present invention, the performance of the software is determined by a previously specified number of iteration steps of the control of the adaptive filter.

The number of iteration steps necessary for a specific minimum criterion corresponds to the performance of a software part or of the algorithm, especially so long as the cause of the iteration persists.

In one preferred specific embodiment of the present invention, the method includes the following steps. Detection of an outlier in the sensor signal by the machine-learning unit. Rejection of the corresponding anti-sensor signal and the corresponding error signal by the control unit.

An outlier in the sensor signal preferably includes an unexpected sharp rise or fall of the sensor signal for a comparatively brief time period. Preferably, the outlier traces back to a disturbance of the corresponding sensor which provides the sensor signal.

In this way, individual outliers in the sensor signal are prevented from being utilized for an unwanted control of the adaptive filter.

An improved method is thus provided for validating a software.

In one preferred specific embodiment of the present invention, the method includes the following steps. Parallel execution of the method, as it is described here, for at least a first sensor signal and a second sensor signal of different sensors. Detection of an error signal above a previously determined limit value in the case of the first sensor signal, the error signal of the second sensor signal lying below the previously determined limit value. Rejection of the error signal of the first sensor signal by the control algorithm.

The algorithm may be applied not only to the outlier, but rather generally: The actual performance is the mathematically abstract distance between the secondary path represented by the neural network and the actual software result, which may be characterized by a discrete number of reciprocal actions.

In other words, a case is detected in which it is ascertained that the performance of a driver-assistance system based on one sensor declines markedly compared to the performance of the driver-assistance system based on a further sensor. For instance, the driver-assistance system is supplied with image data and radar data. If the performance of the driver-assistance system based on image data declines significantly compared to the performance of the driver-assistance system based on radar data, it may be inferred that the driving environment of the image-data sensors has deteriorated, e.g., because of entering into a tunnel. In this case, the error signal based on image data should not be considered in validating the driver-assistance system, so as not to falsely adapt the adaptive filter.

In this way, an unnecessary control of the adaptive filter may be prevented, thereby improving the method for validating the driver-assistance software.

According to one aspect of the present invention, a device is equipped to carry out a method as described here for validating a software.

According to one aspect of the present invention, a control method for an at least semi-autonomous robot includes the following steps. Receiving sensor data of the at least semi-autonomous robot for a driver-assistance system. Adapting the driver-assistance system based on a software performance, which is determined by carrying out the method as described here. Control of the at least semi-autonomous robot as a function of the adapted driver-assistance system.

In general, the especially at least semi-autonomous robot may be a vehicle moving in at least partially automated fashion. Alternatively, the at least semi-autonomous robot may also be another mobile robot, for example, one which moves by flying, swimming, submerging or stepping. For instance, the mobile robot may also be an at least semi-autonomous lawn mower or an at least semi-autonomous cleaning robot or the like.

According to one aspect of the present invention, a computer program includes commands which, upon execution of the computer program by a computer, cause it to carry out a method as described here.

Further measures improving the present invention are presented in greater detail below with the aid of figures, together with the description of the preferred exemplary embodiments of the present invention.

DETAILED DESCRIPTION OF EXAMPLE EMBODIMENTS

Figure 1:
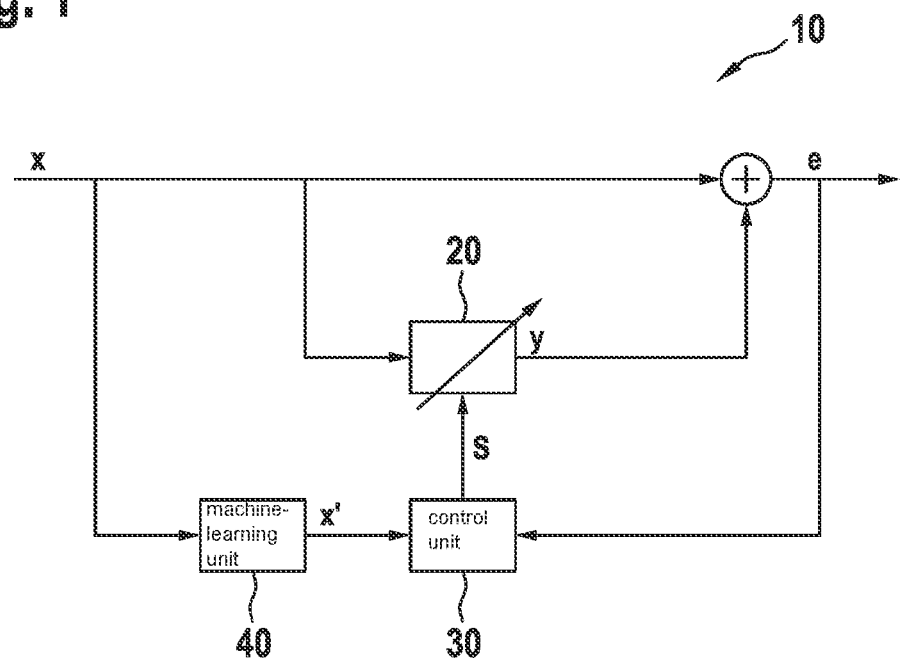
FIG. 1 shows a schematic representation of a device for carrying out the method for validating a driver-assistance software, in accordance with an example embodiment of the present invention.

FIG. 1 shows a device 10 for carrying out the method for validating a software, here a driver-assistance software, including an adaptive filter 20, a control unit 30 and a machine-learning unit 40. A sensor signal x is provided to device 10 by a sensor, e.g., of a robot moving at least in partially automated fashion. In this case, sensor signal x is a radar signal which is used by a driver-assistance software to determine a distance of a vehicle, moving in at least partially automated fashion, from objects.

Sensor signal x is filtered by adaptive filter 20 based on threshold-value parameters of adaptive filter 20. In this case, a threshold-value parameter is error signal e. The resulting signal is a reference signal y, which represents a signal to be expected based on earlier measurements. In this case, reference signal y is basically inverted relative to sensor signal x. In this way, an error signal e may be determined by a simple addition of sensor signal x and reference signal y. Error signal e is thus an indicator for a performance of the driver-assistance software.

Error signal e is subsequently made available to control unit 30. In addition, sensor signal x is provided to machine-learning unit 40. Machine-learning unit 40 determines an anti-sensor signal x' based on sensor signal x and sensor data already evaluated. Machine-learning unit 40, which in this case is a probability neural network, is trained with sensor data already evaluated and therefore contains information as to how reference signal y should best be formed in the case of different sensor signals x, in order to best reflect the reality. For example, overall the sensor signal of the radar sensor is not as strong when there is a light mist as when visibility is clear. By corresponding real-time adapting of the reference signal, the performance of the driver-assistance system is able to be better validated.

Control unit 30 executes a modified LMS algorithm, which determines a control signal s based on anti-sensor signal x' and error signal e. Control signal s controls the at least one threshold-value parameter of adaptive filter 20 accordingly. As a result of the altered threshold-value parameter, reference signal y changes in response to the filtering of sensor signal x by adaptive filter 20. In this way, an adaptive reference signal y is made available. The control circuit described here permits improved validation of the driver-assistance software by an active control of the adaptive filter.

Figure 2:
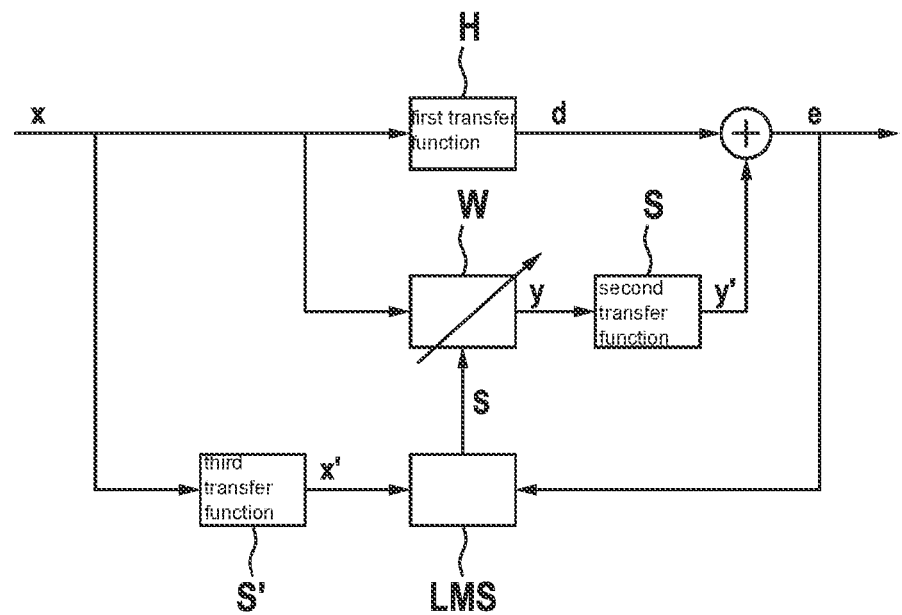
FIG. 2 shows a schematic representation of the method for validating a driver-assistance software, in accordance with an example embodiment of the present invention.

FIG. 2 shows a schematic representation of the method for determining a performance of a driver-assistance software. In comparison to the schematic representation of the device from FIG. 1, FIG. 2 shows transfer functions between the individual signal processings. Thus, control signal x is transformed by a first transfer function H to form a measuring signal d. The representation selected corresponds to the customary illustration in the case of signal processings. Moreover, measuring signal d represents the sensor signal actually measured.

W denotes the adaptive filter in this illustration. A model, which is based on real measurements and is determined by adaptive filter W, may be represented as second transfer function S. Thus, the sensor signal is transformed by adaptive filter W and second transfer function S to form a transformed reference signal y'. A similar representation applies to machine-learning unit 40, which is represented by a third transfer function S' that transforms anti-sensor signal x' from sensor signal x.

Error signal e determined from transformed reference signal y' and measuring signal d is used, as well as anti-sensor signal x', by the modified LMS algorithm to determine control signal s for adaptive filter W.

The path via first transfer function H is referred to as primary stretch or primary path, and the path via second transfer function S is referred to as secondary stretch or secondary path.

Figure 3:
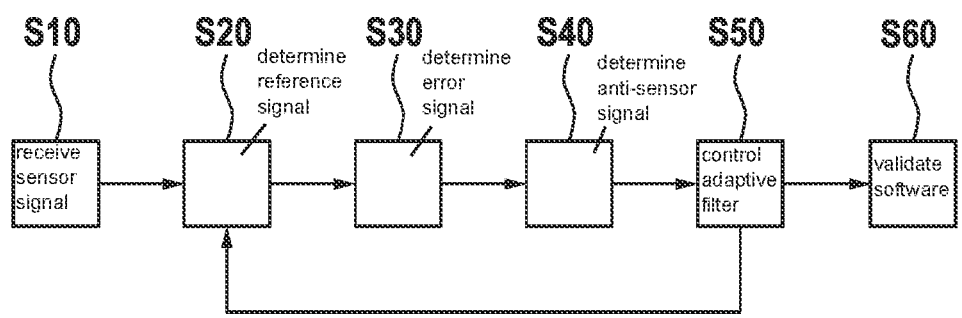
FIG. 3 shows a further schematic representation of the method for validating a driver-assistance software, in accordance with an example embodiment of the present invention.

FIG. 3 shows a further schematic representation of the method for validating a software, in accordance with an example embodiment of the present invention.

In a first step S10, a sensor signal x, which is determined for the software, is received. In a second step S20, a reference signal y is determined by an adaptive filter 20 based on sensor signal x, reference signal y representing an anticipated sensor signal. In a third step S30, an error signal e is determined based on sensor signal x and reference signal y, error signal e representing a performance of the software. In a step S40, an anti-sensor signal x' is determined by a machine-learning unit 40 based on sensor signal x, machine-learning unit 40 being trained with sensor data already evaluated. In a step S50, adaptive filter 20 is controlled by a control unit 30 based on determined error signal e and adaptive anti-sensor signal x'. In a step S60, the software is validated based on determined error signal e.

What is claimed is:

1. A method for validating a software, comprising the following steps:
receiving a sensor signal that is to be processed by the software;
determining, by an adaptive filter, a reference signal based on the sensor signal, the reference signal representing an anticipated sensor signal;
determining an error signal based on the sensor signal and the reference signal, the error signal representing a performance of the software;
determining, by a machine-learning unit, an anti-sensor signal based on the sensor signal, the machine-learning unit being trained with sensor signals already evaluated;
controlling, by a control unit, the adaptive filter based on the determined error signal and the determined anti-sensor signal, wherein the controlling of the adaptive filter includes altering at least one threshold-value parameter of the adaptive filter based on the determined error signal and the determined anti-sensor signal, wherein the control unit uses a modified least-mean-square (LMS) algorithm for controlling the adaptive filter based on a neural network and measures a mathematical distance between existing, learned, referenced sensor sequences and instantaneous real-time sequences to simplify a nonlinear problem of validating the software to a linear problem; and validating the software based on the determined error signal, and the controlled adaptive filter.

2. The method as recited in claim 1, wherein the software is a driver-assistance software.

3. The method as recited in claim 1, wherein the adaptive filter is adapted by the control unit during operation of the software.

4. The method as recited in claim 1, wherein the performance of the software is determined by a previously specified number of iteration steps of the controlling of the adaptive filter.

5. The method as recited in claim 1, further comprising the following steps:
   detecting of an outlier in the sensor signal by the machine-learning unit; and
   rejecting a corresponding anti-sensor signal and a corresponding error signal by the control unit.

6. The method as recited in claim 1, further comprising the following steps:
   executing the method in parallel for at least a first sensor signal and a second sensor signal of different sensors;
   detecting an error signal above a previously determined limit value in the case of the first sensor signal, an error signal of the second sensor signal lying below the previously determined limit value; and
   rejecting the error signal of the first sensor signal by the control unit.

7. The method as recited in claim 1, wherein the sensor signal is from a radar sensor, and/or a LIDAR sensor, and/or an imaging sensor, and/or a thermal sensor.

8. A device configured to validate a software, the device comprising:
   a computer processor, wherein the computer processor is configured to:
      receive a sensor signal that is to be processed by the software;
      determine, by an adaptive filter, a reference signal based on the sensor signal, the reference signal representing an anticipated sensor signal;
      determine an error signal based on the sensor signal and the reference signal, the error signal representing a performance of the software;
      determine, by a machine-learning unit, an anti-sensor signal based on the sensor signal, the machine-learning unit being trained with sensor signals already evaluated;
      control, by a control unit, the adaptive filter based on the determined error signal and the determined anti-sensor signal, wherein the control of the adaptive filter includes altering at least one threshold-value parameter of the adaptive filter based on the determined error signal and the determined anti-sensor signal, wherein the control unit uses a modified least-mean-square (LMS) algorithm for controlling the adaptive filter based on a neural network and measures a mathematical distance between existing, learned, referenced sensor sequences and instantaneous real-time sequences to simplify a nonlinear problem of validating the software to a linear problem; and
      validate the software based on the determined error signal, and the controlled adaptive filter.

9. A control method for an at least semi-autonomous robot, comprising the following steps:

receiving sensor data of the at least semi-autonomous robot for a driver-assistance system;

adapting the driver-assistance system based on a software performance of the driver-assistance system, the software performance being determined by:
   receiving a sensor signal that is to be processed by the software,
   determining, by an adaptive filter, a reference signal based on the sensor signal, the reference signal representing an anticipated sensor signal,
   determining an error signal based on the sensor signal and the reference signal, the error signal representing a performance of the software,
   determining, by a machine-learning unit, an anti-sensor signal based on the sensor signal, the machine-learning unit being trained with sensor signals already evaluated,
   controlling, by a control unit, the adaptive filter based on the determined error signal and the determined anti-sensor signal, wherein the controlling of the adaptive filter includes altering at least one threshold-value parameter of the adaptive filter based on the determined error signal and the determined anti-sensor signal, wherein the control unit uses a modified least-mean-square (LMS) algorithm for controlling the adaptive filter based on a neural network and measures a mathematical distance between existing, learned, referenced sensor sequences and instantaneous real-time sequences to simplify a nonlinear problem of validating the software to a linear problem, and
   validating the software based on the determined error signal, and the controlled adaptive filter; and
controlling of the at least semi-autonomous robot as a function of the adapted driver-assistance system.

10. A non-transitory machine-readable storage medium on which is stored a computer program for validating a software, the computer program, when executed by a computer, causing the computer to perform the following steps:
   receiving a sensor signal that is to be processed by the software;
   determining, by an adaptive filter, a reference signal based on the sensor signal, the reference signal representing an anticipated sensor signal;
   determining an error signal based on the sensor signal and the reference signal, the error signal representing a performance of the software;
   determining, by a machine-learning unit, an anti-sensor signal based on the sensor signal, the machine-learning unit being trained with sensor signals already evaluated;
   controlling, by a control unit, the adaptive filter based on the determined error signal and the determined anti-sensor signal, wherein the control of the adaptive filter includes altering at least one threshold-value parameter of the adaptive filter based on the determined error signal and the determined anti-sensor signal, wherein the control unit uses a modified least-mean-square (LMS) algorithm for controlling the adaptive filter based on a neural network and measures a mathematical distance between existing, learned, referenced sensor sequences and instantaneous real-time sequences to simplify a nonlinear problem of validating the software to a linear problem; and validating the software based on the determined error signal, and the controlled adaptive filter.

* * * * *